United States Patent
Monson et al.

(10) Patent No.: US 7,891,410 B1
(45) Date of Patent: Feb. 22, 2011

(54) DEVICES FOR HEAT EXCHANGE

(75) Inventors: Robert J. Monson, St. Paul, MN (US);
Jianhua Yan, Woodbury, MN (US);
Brian T. Van Lear, Hastings, MN (US);
Kevin J. Thorson, Eagan, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 287 days.

(21) Appl. No.: 12/146,718

(22) Filed: Jun. 26, 2008

(51) Int. Cl.
*F28F 7/00* (2006.01)

(52) U.S. Cl. ..................................... 165/80.2; 165/80.3

(58) Field of Classification Search .................. 165/80.3, 165/185, 104.22, 104.23; 361/694, 690
See application file for complete search history.

(56) References Cited

U.S. PATENT DOCUMENTS

| | | | |
|---|---|---|---|
| 4,501,319 A * | 2/1985 | Edelman et al. ................. 165/84 |
| 4,667,877 A * | 5/1987 | Yao et al. .................. 239/102.2 |
| 4,923,000 A * | 5/1990 | Nelson ......................... 165/122 |
| 5,758,823 A * | 6/1998 | Glezer et al. ..................... 239/4 |
| 6,123,145 A * | 9/2000 | Glezer et al. ............ 165/104.33 |
| 6,457,654 B1 * | 10/2002 | Glezer et al. ..................... 239/4 |
| 6,588,497 B1 * | 7/2003 | Glezer et al. ................... 165/84 |
| 6,628,522 B2 * | 9/2003 | Trautman et al. ............ 361/704 |
| 6,848,631 B2 * | 2/2005 | Monson et al. .......... 239/102.1 |
| 7,023,697 B2 * | 4/2006 | Pokharna et al. ............ 361/695 |
| 2003/0075615 A1 * | 4/2003 | Saddoughi ............... 239/102.2 |

OTHER PUBLICATIONS

Co-pending U.S. Appl. No. 12/146,696, filed Jun. 26, 2008.
Nextreme Thermal Solutions. Documents obtained from www.nextreme.com, dated Mar. 13, 2008, 4 pages.
Bar-Cohen et al. "Optimum Arrays of Longitudinal, Rectangular Fins in Convective Heat Transfer." Heat Transfer Engineering, vol. 6(3) 1985, pp. 68-78.
Holman, J.P. Heat Transfer, $6^{th}$ ed. 1986, pp. 43-47.

* cited by examiner

*Primary Examiner*—Teresa J Walberg
(74) *Attorney, Agent, or Firm*—Hamre, Schumann, Mueller & Larson, P.C.

(57) ABSTRACT

A device and method that exchanges heat is described, which includes intaking air into a chamber and then forcing air from holes of a heat conducting surface that fluidly communicate with the chamber to create a toroidal mass of air resulting from vortex shedding. A pump, for example a flexible diaphragm, is employed to increase and decrease a volume of the chamber in communication with the holes. When the volume of the chamber is increased (air intake), a boundary layer of heat breaks up by the heat conducting surface which helps to improve cooling. When the volume of the chamber is decreased, jets of air are discharged from the holes to create vortices of air that cause vortex shedding and can also help disrupt the boundary layer of heat.

20 Claims, 6 Drawing Sheets

DEVICES FOR HEAT EXCHANGE

FIELD

A device and a method for heat exchange is described, where heat is dissipated by moving air into and out of a chamber through a heat conducting surface to disrupt a boundary layer of heat present over the conducting surface and to cause vortex shedding.

BACKGROUND

Heat exchange devices and methods are widely known and used. Heat exchange devices and methods have been employed in a variety of hot spots including various sources of heat such as electronics, processors, their assemblies, and any heat producing component or heat source having a need to dissipate heat.

Current methods of heat dissipation rely on forced air convection delivered along heat conductive surfaces. Oftentimes, fans are used to initiate such forced air convection. Other examples may rely on natural convection to dissipate heat. For instance, cooling fins have been employed, where such cooling fins usually are solid in construction and are relatively flat and thin profiled structures that project from the heat producing component. Such known heat exchange devices and methods may be suitable in some applications. There is need, however, to provide cooling capabilities that may provide lower energy requirements, but also do not significantly alter design profiles of products generating heat and do not increase energy necessary to carry out heat dissipation.

There remains a need to provide alternative heat exchange devices and methods.

SUMMARY

The following technical disclosure describes an improved heat exchange device and method for dissipating heat. Generally, the devices and methods described provide for heat dissipation by moving air into and out of a chamber to disrupt a boundary layer of heat and create jets of air through a heat conducting surface to cause vortex shedding.

The devices and methods described herein may be employed to dissipate heat from a variety of hot spots including various separate sources of heat such as electronics, processors, their assemblies, and any heat producing component or heat source or product having a need to dissipate heat. The devices and methods described herein can enjoy benefits, such as more effective heat transfer with lower power requirements for operation. Other benefits may include a more efficient heat exchange device that operates only when needed and that does not require design profiles of products generating heat or their assemblies to be significantly altered.

Generally, the heat exchange devices described herein include a chamber disposed between a heat conducting surface and a pump which is configured to cause increases and decreases in the volume of the chamber. A driver mechanism is configured to activate the pump to cause the changes in volume. Disruption of the boundary layer is caused by air being drawn into or replenished into the chamber by activation of the pump, thereby increasing the volume of the chamber. The intake or "inhalation" of air into the chamber increases the volume of the chamber, which results in disruption of the boundary layer of heat.

When the volume of the chamber decreases, air is forced from the chamber and out of one or more holes in the heat conducting surface. The air expelled from the hole(s) also is effective for dissipating heat by creating vortices of air that cause vortex shedding which further disrupts the boundary layer of heat on the heat conducting surface.

In one embodiment, a heat exchange device includes a heat conducting surface including at least one hole extending therethrough. A flexible diaphragm is connected to the heat conducting surface, and a chamber is between the heat conducting surface and the flexible diaphragm. The chamber has a volume which can decrease and increase when the flexible diaphragm is vibrated. A driver mechanism is provided to vibrate the flexible diaphragm which causes decrease and increase in the volume of the chamber as the flexible diaphragm vibrates. When the volume of the chamber increases, a boundary layer of heat can be disrupted. When the volume of the chamber decreases, air from the chamber is discharged through the hole to create vortices of air that cause vortex shedding. By intake of air into and then expelling air from the chamber, jets of air are created where a uniform toroidal mass of air can travel away from the hole to break-up the boundary layer of heat on the heat conducting surface.

In another embodiment, a method of dissipating heat from a heat conducting surface having at least one hole therein includes conducting heat to the heat conducting surface so that a boundary layer of heat develops around the heat conducting surface. The boundary layer of heat is broken up or disrupted by air being drawn into or replenished into a chamber in fluid communication with the hole. The intake or "inhalation" of air into the chamber increases the volume of the chamber, which results in disruption of the boundary layer of heat. In addition, air from the hole is discharged in a direction generally perpendicular to the heat conducting surface. The hole is formed so that each jet of air into and then out of the chamber can create a uniform toroidal mass of air that travels away from the hole to break-up the boundary layer of heat.

In yet another embodiment, a PC circuit board incorporates at least some of the heat exchange principles described herein. In yet another embodiment, a finned heat sink incorporated at least some of the heat exchange principles described herein.

DETAILED DESCRIPTION

Devices and methods for heat exchange are described. Generally, heat dissipation is provided by intaking air through a hole of a heat conducting surface into a chamber in fluid communication with the hole, and across a boundary layer of heat to disrupt the boundary layer of heat. Air in the chamber also is forced through the boundary layer of heat to create vortices of air that cause vortex shedding, which further disrupts the boundary layer of heat.

The inventive concepts described herein can enjoy many benefits, such as more effective heat transfer with lower power requirements for operation of a heat exchange device. Other benefits may include a more efficient heat exchange device that operates only when needed, and a more desirable heat exchange device that does not require design profiles of heat generating products or their assemblies to be significantly altered.

Generally, devices and methods for heat exchange described herein include intaking and forcing air through a boundary layer of heat. A pump is employed to create jets of air by drawing air into and expelling air out of a chamber containing a volume of air. The air drawn into the chamber disrupts the boundary layer of heat. Air is expelled from the chamber to create vortices of air that cause vortex shedding, which further helps to disrupt the boundary layer of heat. Air is a convenient cooling transport gas or fluid to interact with surfaces of the heat exchanger devices described herein and especially for open to atmosphere systems. It will be appreciated that this application is not limited to air as the interacting fluid and that other interacting fluids, including gas, liquid and mixtures thereof, such as but not limited to argon, a perfluorocarbon such as Fluoroinert®, and mixtures thereof, or other liquids and gases, individually or as mixtures, can be employed. Therefore, although this description often refers to air, it is to be realized that other interacting fluids can be used.

Figure 1:
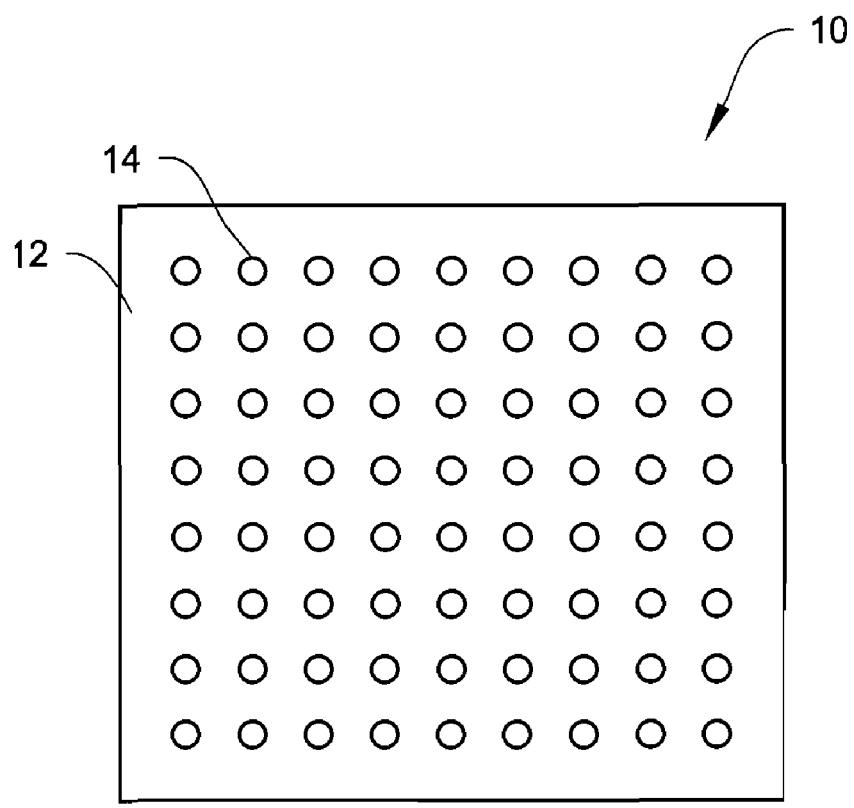
FIG. 1 is a top view of one embodiment of a heat exchange device.
Figure 2:
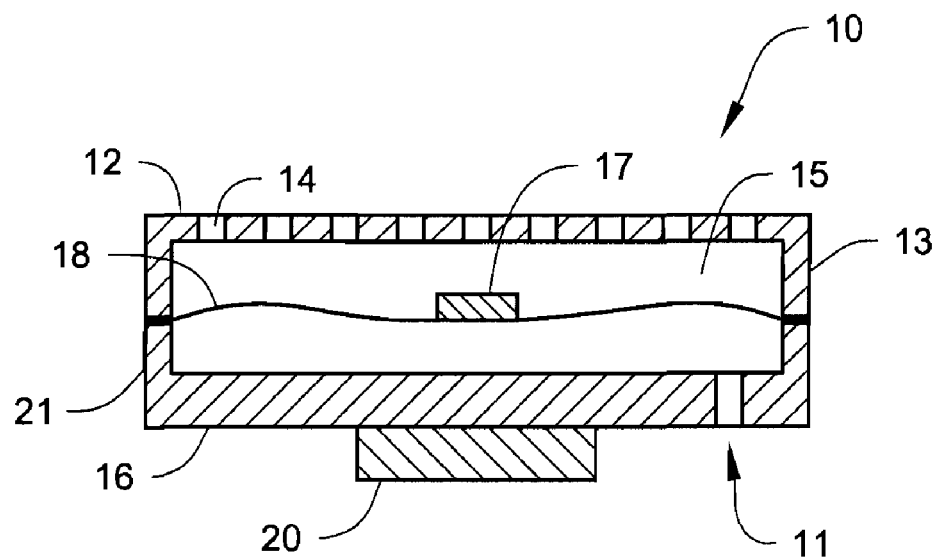
FIG. 2 is a side sectional view of the heat exchange device of FIG. 1 connected to a heat producing device.
Figure 3:
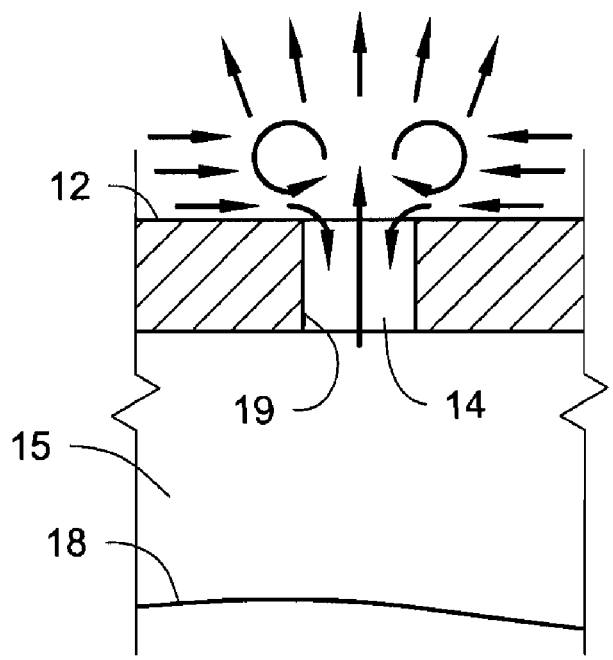
FIG. 3 is a close-up partial sectional view of the heat exchange device of FIG. 1.

Turning to FIGS. 1-3, an embodiment of a heat exchange device 10 is shown. The heat exchange device 10 includes a heat conducting surface 12, a generally enclosed chamber 15, a pump 18, and a driver mechanism 17. In one embodiment, the chamber 15 is formed by an enclosure of the heat conducting surface 12 and the pump 18. The heat conducting surface 12 includes a plurality of holes 14 through which jets of air are discharged.

In the illustrated embodiment, the device 10 is intended to be a separate device that is attached to a heat producing component 20 that needs to be cooled. The attachment between the device 10 and the heat producing component 20 permits heat to be conducted from the heat producing device to the heat conducting surface 12 of the device 10, where the conducted heat is then dissipated from the heat conducting surface 12. Any form of attachment that permits this heat conduction path to the heat conducting surface 12 can be used.

The chamber 15 defines a volume that contains an amount of air. The chamber 15 is disposed between the heat conducting surface 12 and the pump 18. The pump 18 is configured to change the volume of air within the chamber 15 when the pump 18 is activated by increasing and decreasing the volume of the chamber. When the volume is increased, air is drawn into the chamber 15 through the plurality of holes. When the volume is decreased, air is discharged through the plurality of holes 14. The intake and expelling of air act as jets of air into and out of the chamber 15. The driver mechanism 17 is configured to activate the pump 18. A vent 11 also may be employed to facilitate operation or movement of the pump 18, so that air is not trapped behind the pump 18.

The holes 14 also allow air to enter the chamber 15 when the volume of the chamber increases thereby drawing air into the chamber 15 and increasing the volume inside. In one embodiment, the pump 18 is a movable structure that, when it is moved, allows the volume within the chamber 15 to increase and decrease. For example, when the pump 18 is activated it can draw air into the chamber 15 through the holes 14 by increasing the volume of the chamber 15, and can force or expel air out of the holes 14 by decreasing the volume of the chamber 15.

In one embodiment, the pump 18 is configured as a structure that vibrates and/or oscillates when activated to create the change in volume of the chamber 15. As one example, the pump 18 is a diaphragm constructed of a flexible sheet connected to the heat conducting surface 12. As shown, the diaphragm is configured as a thin, membrane-like sheet. By way of example, the diaphragm as shown may be connected at its periphery to side walls 13 which extend downward from the heat conducting surface 12. The diaphragm is arranged and configured to at least span an area occupied by the plurality of holes 14. That is, the diaphragm is constructed so that each of the holes 14 can intake and expel air when the diaphragm is activated, so that the holes act as synthetic jets.

It will be appreciated that the pumps described herein are not limited to flexible diaphragms. The pump may be any movable or oscillating structure that draws air into the chamber and can expel air from the chamber. For example, the pump may be a non-flexible diaphragm, such as but not limited to a plunger or sliding mechanism.

In the example illustrated, the heat exchange device 10 is configured to intake air into a chamber 15 and force air from the chamber 15 across a boundary layer of heat around the heat conducting surface 12, which is conducted to the heat conducting surface 12, for example as a result of heat generated by the heat producing component 20. In certain embodiments, the heat exchange devices described herein may be employed to dissipate heat from a variety of hot spots including various separate sources of heat such as electronics, processors, their assemblies, and any heat producing component, source, or product having a need to dissipate heat.

As shown by FIGS. 1-3, the driver mechanism 17 activates the pump 18 to change the volume of the chamber 15. As shown in FIG. 3, the boundary layer of heat is disrupted when air is drawn into the holes 14 (see the cross arrows generally parallel to the heat conducting surface 12 and arrows entering the hole 14). Air is expelled from the chamber 15, which can further disrupt the boundary layer of heat (see arrow directed out of the hole 14). By expelling air from the chamber 15, vortices of air are created that cause vortex shedding to further disrupt and dissipate the boundary layer of heat. As shown, toroidal masses of air (see circular arrows) are caused by vortex shedding. By first drawing air into the chamber and then expelling air from the chamber, the boundary layer of heat is disrupted, which improves and facilitates heat dissipation away from the heat conducting surface 12. For ease of illustration, FIG. 3 shows one hole 14. It will be appreciated, however, that the other holes 14 operate in substantially the same manner.

Any size and shape of the holes 14 can be used as long as the holes 14 are configured to draw in air and expel air in a manner to result in disruption of the boundary layer of heat and vortex shedding. In one embodiment, the holes 14 are circular and approximately twenty hundredths of an inch (about 0.02 inches) in diameter. It will be appreciated that such a size and shape are meant to be exemplary only. In addition, the holes 14 need not have the same shape and size. Instead, the shape and size of the holes can be tailored to satisfy specific boundary layer disruption needs.

It further will be appreciated that the amount of holes 14 shown in FIGS. 1-3 is for illustration purposes only. As the holes 14 may be designed with significantly small sizes, a surface such as heat conducting surface 12 may include a large number, possibly numbering in the hundreds or thousands, of "micro" holes as necessary and/or desired for the particular cooling application. That is, the shape and size of the holes 14, the amount of holes 14, and their pattern can be selected based on the needs for a desired application.

To achieve vortex shedding, the holes 14 are defined by annular surfaces 19. (See FIG. 3) As best shown in FIGS. 2 and 3, the heat conducting surface 12 includes opposite sides, where each hole 14 includes an annular surface 19 that is generally perpendicular with respect to the opposite sides. That is, the annular surfaces 19 with respect to the side surfaces of the heat conducting surface 12 have relatively perpendicular or sharper corners. Applicants have found that perpendicular or sharp corners on at least the outlets of the holes 14 is best for facilitating the desired vortex shedding.

As shown in FIGS. 2-3, the heat exchange device 10 is shown attached to the heat producing component 20 via a heat conducting member 16. The heat conducting member 16 is configured to conduct heat from the heat producing component 20 to the heat conducting surface 12 of the exchange device 10. As shown, the heat conducting member 16 is connected to the heat conducting surface 12 via the side walls 13 and shoulders 21 extending from the heat conducting member 16. It will be appreciated that the heat producing component 20 can be connected to the heat conducting surface 12 in any suitable manner sufficient to conduct heat from the heat producing component to the heat conducting surface.

Figure 5:
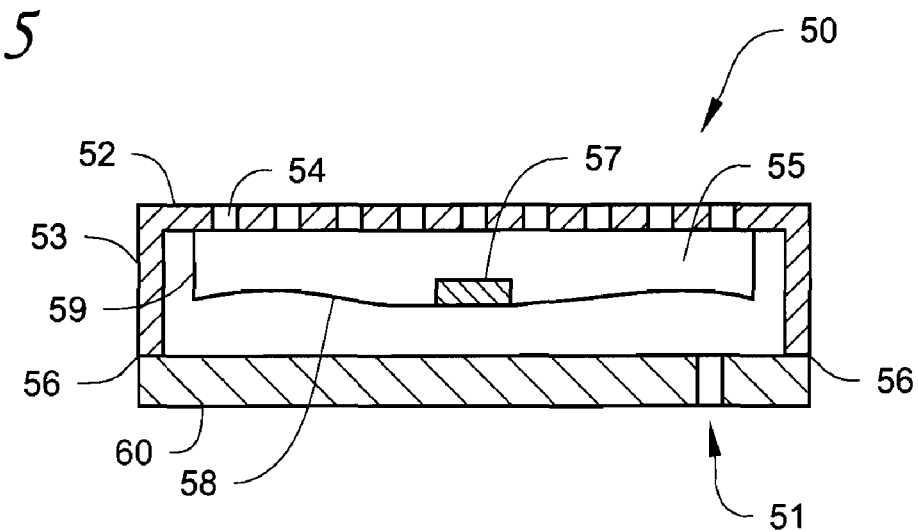
FIG. 5 is a side sectional view of another embodiment of a heat exchange device.

With reference to FIG. 5, an embodiment of a heat exchange device 50 is illustrated where a heat conducting surface 52 is directly connected to a heat producing component 60 via side walls 53 of the heat conducting surface 52. As with the heat exchange device 10, the heat conducting surface 52 includes holes 54 therethrough. A driver mechanism 57 is employed to drive the pump 58. It will be appreciated that the pump 58 and driver mechanism 57 may be the same as described above, and are not further detailed. It further will be appreciated that a vent 51 may be employed to facilitate operation or movement of the pump 58, so that air is not trapped behind the pump 58.

As in the embodiment in FIGS. 1-3, the heat exchange device 50 is preferably a separate device that is suitably attached to the heat producing component 60. Bottom ends 56 of the side walls 53 can be attached to the heat producing component 60 using any suitable method that allows heat to be conducted through the attachment boundary and up through the side walls to the heat conducting surface 52. It also will be appreciated that the heat exchange device itself may be the generating source of heat. For example, holes and a pump may be incorporated into various heat generating components, thereby adding a cooling function to such devices.

FIG. 5 also shows that the pump 58 is connected to an underside of the heat conducting surface 52 through a support 59, rather than to the side walls 13 as in FIGS. 1-3. The support 59 is configured to help form the chamber 55 between the heat conducting surface 52 and the pump 58.

Figure 4:
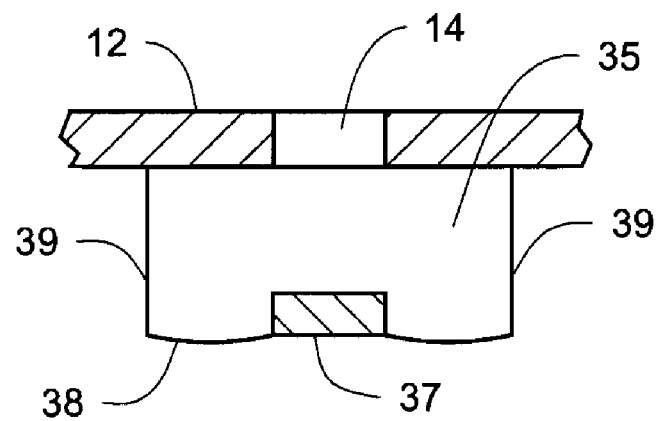
FIG. 4 is a close-up partial sectional view of one embodiment where a diaphragm is associated with a single hole.

FIG. 4 shows another embodiment of a pump 38 which is associated with a single hole 14 for creating the jets of air from that single hole. Other holes in the heat conducting surface 12 can each have their own pump 38. Each pump 38 (or diaphragm) can be constructed as a flexible sheet as in the embodiments in FIGS. 1-3 and 5, and is driven by a driver mechanism 37. As shown, the pump 38 is connected to an underside of the heat conducting surface 12 via a support 39 to define a chamber 35 for the hole 14. In this embodiment, the pumps 38 associated with each hole 14 would be activated to individually increase and decrease the volume of the chamber so as to create the jets of air through the holes 14 and to help disrupt the boundary layer on the heat conducting surface 12.

As illustrated in FIGS. 1-5, the outer side of the heat conducting surface is shown as generally planar. It will be appreciated, however, that the shape of the outer side of the heat conducting surface shown is merely exemplary, as other shapes, patterns, profiles, and other suitable modifications may be made as necessary and/or desired. The particular construction of the heat conducting surface for the heat exchange device is not meant to be limiting, but may be dependent upon the heat dissipation needs for a particular application.

Turning specifically to the driver mechanism, the driver mechanism is configured to drive the pump so that it moves or oscillates. When the pump is a flexible diaphragm, the diaphragm may be driven or excited in a variety of ways, and movement of the diaphragm upon activation increases and decreases the volume of the chamber to create the synthetic jets.

In the examples shown, the driver mechanism is a motor disposed on the diaphragm. However, the motor need not be on the diaphragm. Instead, the motor may be disposed proximate the diaphragm(s) and in driving engagement with the diaphragm(s) to impart vibration or movement on the diaphragms. In addition, multiple motors may be employed.

In one embodiment, the driver mechanism is a motor, for example a cell phone vibration motor that vibrates, oscillates, or otherwise moves the diaphragm. When the diaphragm is vibrated or oscillated, it moves up and down to cause a change in the volume of the chamber. When the diaphragm moves downward, the volume of the chamber increases causing air from above the heat conducting surface to be drawn into the hole(s). The air drawn into the chamber disrupts the boundary layer of heat. When the diaphragm moves upward, the volume of the chamber decreases, which forces air to be expelled out of the hole(s) to create vortices of air and cause vortex shedding. The air being drawn into the chamber and also expelled from the chamber act disrupts the boundary layer of heat. Drawing air into the holes also can help cause heating of the inside surface of the holes and the interior surface of the heat conducting surface. This helps increase the surface area for heat exchange, helping to increase the resulting cooling effect.

A cell phone vibration motor has been found to perform adequately as the driver for the diaphragm. A cell phone vibration motor has low power requirements and is relatively inexpensive. Further, a cell phone vibration motor or equivalent can provide a desired weight or mass attached to the pump, which can result in a potential resonance of the motor imparting movement on the diaphragm. However, any type of motor can be used for driving the diaphragm, especially motors having low power requirements. The motor may be activated in many ways, for example by an electronic switch that may be either a wired connection or a remote control, and may be battery powered.

Figure 6:
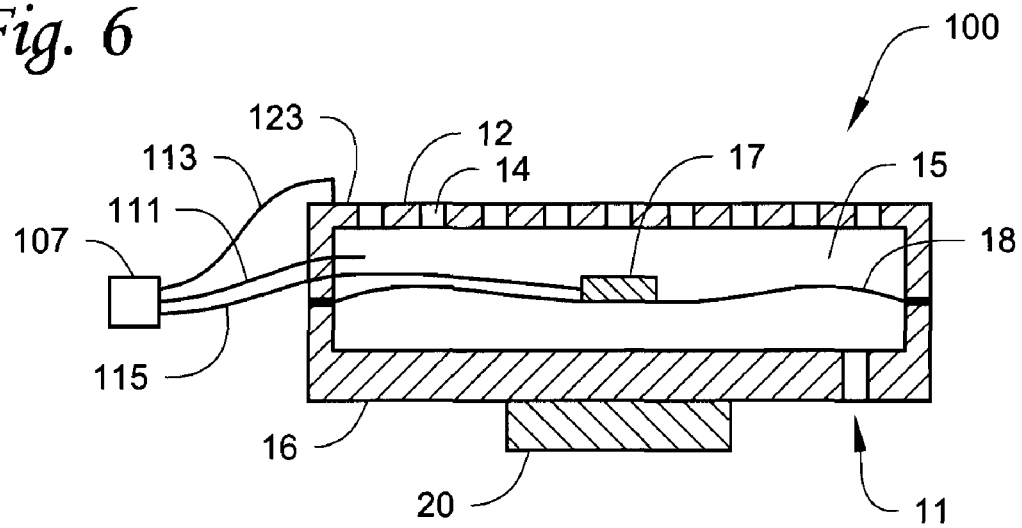
FIG. 6 is a side sectional view of one embodiment using a thermocouple to activate a driver mechanism for a heat exchange device.

In some embodiments, the motor may be powered by a thermocouple that is configured to activate the motor when a current is generated in the presence of a sufficient heat differential. FIG. 6 shows an embodiment of an exemplary thermocouple implementation that may be employed in any of the heat exchange devices described herein.

FIG. 6 shows one embodiment of a thermocouple 107 for a heat exchange device 100. For ease of description, like reference numbers in FIG. 6, which refers to elements previously described, are not further detailed.

As shown in FIG. 6, thermocouple 107 includes a main control unit having wires 111, 113 connected thereto. The wires 111, 113 are constructed of the same heat conductive material, where leads of the wires 111, 113 are placed in different locations of the heat exchange device 100. It will be appreciated that by same heat conductive material, the wires 111, 113 are meant to at least have the same heat conducting properties. As shown, for example, wire 111 is exposed to the temperature within the chamber 15 of the heat exchange device 100, and wire 113 is connected to the outer side 123 of the heat conducting surface 12.

In operation, when heat is conducted to the heat exchange device 100, such as from heat producing component 20, there is a temperature differential between the temperature within the chamber 15 and the temperature of the outer side 123 of the heat conducting surface 12. Since the wires 111, 113 are made of the same heat conductive material, but are exposed to different temperatures, the thermal potential difference is converted into an electric potential difference which, if the electric potential difference is sufficient, drives the motor via power line 115 connected to the motor.

It will be appreciated that the particular placement of the wires 111, 113 is not limited to the specific configuration shown. Other placement configurations may be equally or more suitable, as long as the wires of the thermocouple are exposed to a temperature differential providing a sufficient thermal potential difference. It also will be appreciated that the wires can be constructed of a different heat conductive material, where the wires are meant to at least have different heat conducting properties. As long as a temperature differential exists, the different heat conducting properties of the wires can result in the creation of an electric potential difference which, if the electric potential difference is sufficient, drives the motor via the power line connected to the motor.

Vortex Generated Flow in Circuit Boards

As described above, it will be appreciated that a heat exchange device itself may be the generating source of heat. For example, one or more holes and one or more pumps may be built into various positions of a heat generating component to create the synthetic jets, thereby adding a cooling function to such components.

In some embodiments, a circuit board can include a built in heat exchange device. The ability to cool processors, for example on personal computer (PC) circuit boards, in tight spaces is an increasing challenge due to increased processor power consumption. A significant challenge in this cooling is to disrupt a boundary layer of high temperature air surrounding the circuit board. By employing some of the above inventive principles for disrupting a boundary layer of heat, a circuit board may incorporate a cooling function built into the circuit board to improve thermal transfer capability and cooling of the circuit board.

Figure 7:
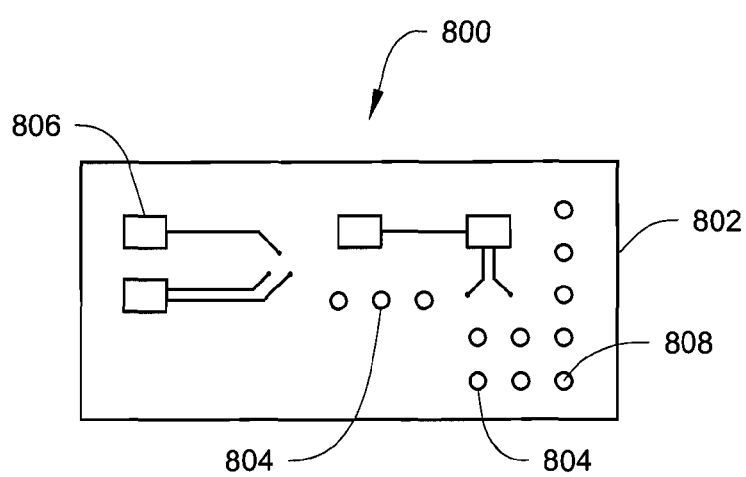
FIG. 7 is top view of one embodiment of a PC circuit board.
Figure 8:
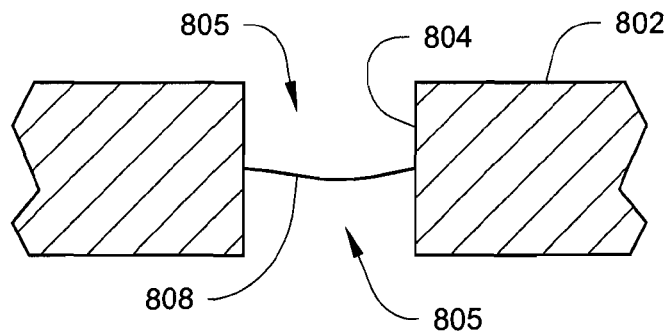
FIG. 8 is a partial side sectional view of the PC circuit board in FIG. 7.

FIGS. 7 and 8 show an embodiment of a PC circuit board 800 having a heat exchange device built into the PC board. The circuit board includes a board 802 having various circuit components 806 disposed on the board 802. The board 802 is a heat conducting surface that conducts heat, for example when the various circuit components are in operation. The board 802 includes a number of holes 804 extending through major surfaces of the board 802. As shown in FIG. 8, a hole 804 extends generally perpendicular through the board 802, where the hole 804 includes an outlet on both sides of the board 802. For illustration purposes only, one hole 804 is shown in FIG. 8, however, one will appreciate that the other holes 804 are configured in the same or similar fashion.

As shown in FIG. 7, a number of holes 804 may be provided at various positions through the board 802. It will be appreciated that the amount of holes 804 shown is for illustration purposes only. As the holes 804 may be designed with significantly small sizes, the board 802 may include one hole or a large number of holes, possibly numbering in the hundreds or thousands, of "micro" holes as necessary and/or desired for the particular cooling application. Further, any size and shape of the holes 804 can be used as long as the holes 804 are configured to draw in air and expel air by activation of a pump 808 (described below) in a manner to result in disruption of the boundary layer of heat and vortex shedding. As one example, the holes 804 are circular and approximately twenty hundredths of an inch (about 0.02 inches) in diameter. It will be appreciated that such a size and shape are meant to be exemplary only. In addition, the holes 804 need not have the same shape and size. Instead, the shape and size of the holes can be tailored to satisfy specific boundary layer disruption needs. Thus, one would appreciate that the shape and size of the holes 804, the amount of holes 804, and their pattern can be selected based on the needs for a desired heat transfer application.

Turning to the pump 808, each hole 804 includes its own pump 808 disposed within the hole 804. A chamber 805 is formed on both sides of the pump 808. Each chamber 805 is disposed between the pump 808 and one of the outlets of the hole 804. The chambers 805 face toward the sides of the board 802. Each chamber 805 has a volume which can increase and decrease when the pump 808 is moved thereby creating a jet of air into and out of the hole 804. In some embodiments, the pump 808 is a piezo activated component that includes a material that generates an electric potential in response to a sufficient temperature change. That is, when a sufficient temperature change occurs the piezo activated component can oscillate, vibrate, or otherwise move to increase and decrease the volume in the chambers 805.

Similar to the heat exchange devices described, when the volume of any of the chambers 805 increases, the boundary layer of heat present around the PC circuit board can be broken up. As the volume of any of chamber 805 decreases, air is forced from the chamber 805 and out of the respective outlet of the hole to create the vortices of air or uniform toroidal masses of air that travels away from one of the outlets to further dissipate the boundary layer of heat present around the PC circuit board. The air discharged from the hole(s) also is effective for disrupting the boundary layer of heat on the heat conducting surface. That is, each outlet of a hole 804, pump 808, and chamber 805 make up a double acting synthetic jet on both sides of the circuit board.

As shown, the improved PC circuit board 800 effectively provides synthetic jets built in the surface of the board 802 without impacting the profile and design of the PC circuit board 800 or its functionality. The holes 804, chambers 805, and piezo activated component used for the pumps 808, which consume very little power, facilitate air flow in a direction in line with the axis of the holes 804 and can create air flow to cool both sides of the PC circuit board 800.

Figure 9:
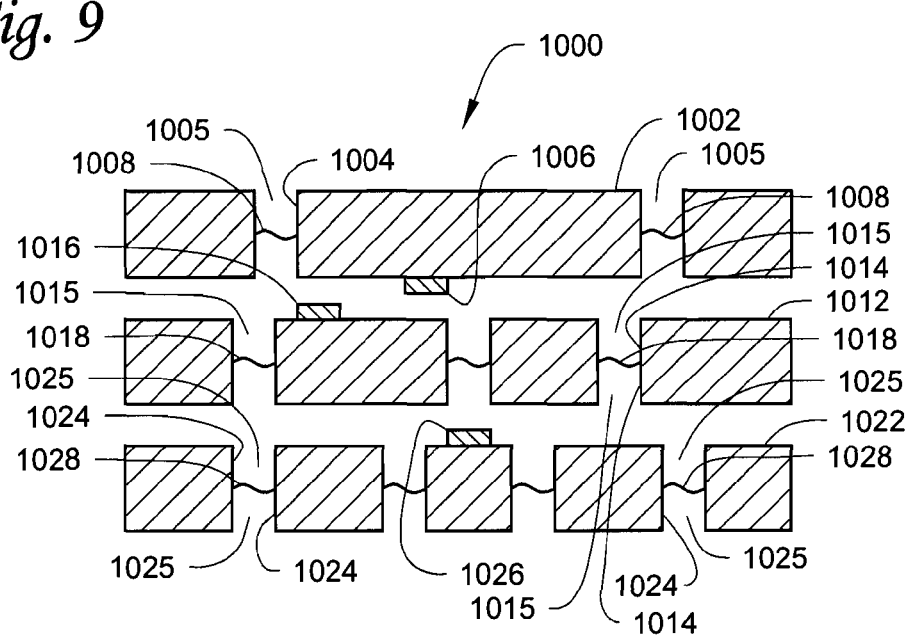
FIG. 9 is a partial side sectional view of another embodiment of a PC circuit board.

FIG. 9 shows another embodiment of a PC circuit board 1000, where multiple boards 1002, 1012, 1022 make up an assembly. As with PC circuit board 800, each board 1002, 1012, 1022 includes various circuit components 1006, 1016, 1026 respectively. The boards 1002, 1012, and 1022 are a plurality of heat conducting surfaces disposed adjacent each other and including a space therebetween. Similar to PC circuit board 800, board 1002 includes at least one hole 1004 extending perpendicularly through its major sides, a pump 1008 disposed within each hole 1004, where chambers 1005 are formed between the pump 1008 and outlets of a respective hole 1004. Likewise, board 1012 includes at least one hole 1014 extending perpendicularly through its major sides, a pump 1018 disposed within each hole 1014, where chambers 1015 are formed between the pump 1018 and outlets of a respective hole 1014. Likewise, board 1022 includes at least one hole 1024 extending perpendicularly through its major sides, a pump 1028 disposed within each hole 1024, where chambers 1025 are formed between the pump 1028 and outlets of a respective hole 1024.

As shown, the holes of each board are configured such that a hole of one board can be aligned with a hole of another board, or such that a hole of one board is offset from a hole of another board. Likewise, combinations of aligned and offset holes may be employed. With aligned holes, air can flow from two directions at the same or different times from two different boards to help facilitate disruption of a boundary layer of heat. Offset holes allow a synthetic jet (i.e. hole, pump, and chamber) from one board to cool circuit or electronic components of another board.

Vortex Generated Flow in Finned Heat Sinks

As so far illustrated, the outer side of the heat conducting surface has been shown as generally a single planar surface. It will be appreciated, however, other shapes, patterns, profiles, and other suitable modifications may be made as necessary and/or desired. The particular configuration of the heat conducting surface for the heat exchange device is not meant to be limiting, but may be dependent upon the heat dissipation needs for a particular application.

In some examples, cooling fins have been employed as a desired a heat conducting surface or heat sink. Cooling fins are generally well known in the art of heat transfer and cooling devices, and can be helpful dissipation of heat having both natural and forced air convection transfer characteristics. Known cooling fin structures usually are solid in construction throughout the entire fin structure and are relatively flat and thin profiled structures that project from a heat generating component.

Oftentimes, metal extrusions are used to create cooling fins that are attached to a thicker base. The base spreads heat evenly, such that the fins receive similar heat fluxes. It is desired that the fins are optimized and efficiently constructed to have minimal thermal resistance from the base to the fin tip. It also is desired that an optimal geometry and an optimal amount of material is used for the fins given certain weight and space constraints associated with a particular thermal transfer design.

Another important consideration is the spacing of the fin surfaces from each other. If the fins are too close, the thermal boundary layers between adjacent fins will overlap, causing low effective heat transfer otherwise known as a thermal stagnation zone. However, more fins are desired to utilize more surface area for heat transfer. The Elenbaas fin spacing criteria was developed to determine the optimal fin spacing in order to create an efficient heat sink (see Equation 1):

$$\text{Optimal fin spacing} = \{(50 \times v^2)/\eta g \beta (T_w - T_{\infty}) Pr\}^{1/4}, \quad \text{Equation 1}$$

where x is the fin height, with respect to gravity; $v$ is the kinematic viscosity; $\eta$ is the Fin Efficiency (see below); g is the gravitational constant; $\beta$ is the volumetric coefficient of expansion which is equal to the inverse of the film temperature for ideal gases, in absolute temperature units, such as Kelvin; $T_w$ is the wall temperature; $T_{\infty}$ is the ambient temperature; and Pr is the Prandtl number. Equation 1 is based upon data from Bar-Cohen and Jelinek, *Optimal Arrays of Longitudinal, Rectangular Fins in Convective Heat Transfer*, Heat Transfer Engineering, Volume 6, no. 3 1986, Hemisphere Publishing Corporation.

Fin Efficiency is determined by Equations 2 and 3:

$$\text{Fin Efficiency} = \tan h(mH)/(mH); \text{ and} \quad \text{Equation 2}$$

$$m = (hP/KA)^{0.5}, \quad \text{Equation 3}$$

where H is the fin height, aligned with the gravitational vector; P is the perimeter of the fin; A is the cross sectional area of the fin; K is the fin material conductivity; and h is the convection heat transfer coefficient. Equations 2 and 3 are referenced in *Heat Transfer*, J. P. Holman, McGraw-Hill, 6$^{th}$ Edition, 1986, NY. FIGS. 10-13 show respective embodiments for finned heat sinks 1100, 1300, 1400 that are different from such traditional cooling fin structures. The finned heat sinks described include fins that are not of solid construction throughout the fin structure. Rather, the fin structure includes holes and a channel to allow for intake of air and expelling of air through holes to disrupt stagnant thermal boundary layers of heat and to create vortex shedding that can further help break up and dissipate stagnant thermal boundary layers around the finned heat sink.

Improved finned heat sink designs are described, which utilizes vortex generated air flow to break up a thermal boundary layer. Generally, the number of heat sink fins can be increased by using closer fin spacing (i.e. smaller spacing between the fins) than the Elenbaas fin spacing criteria. By employing the inventive concepts herein, the Elenbaas minimum fin spacing criteria used to determine the smallest possible heat sink fin spacing, or gap between fins, is no longer a primary design criteria (see Bar-Cohen and Jelinek, *Optimal Arrays of Longitudinal, Rectangular Fins in Convective Heat Transfer*).

Figure 10:
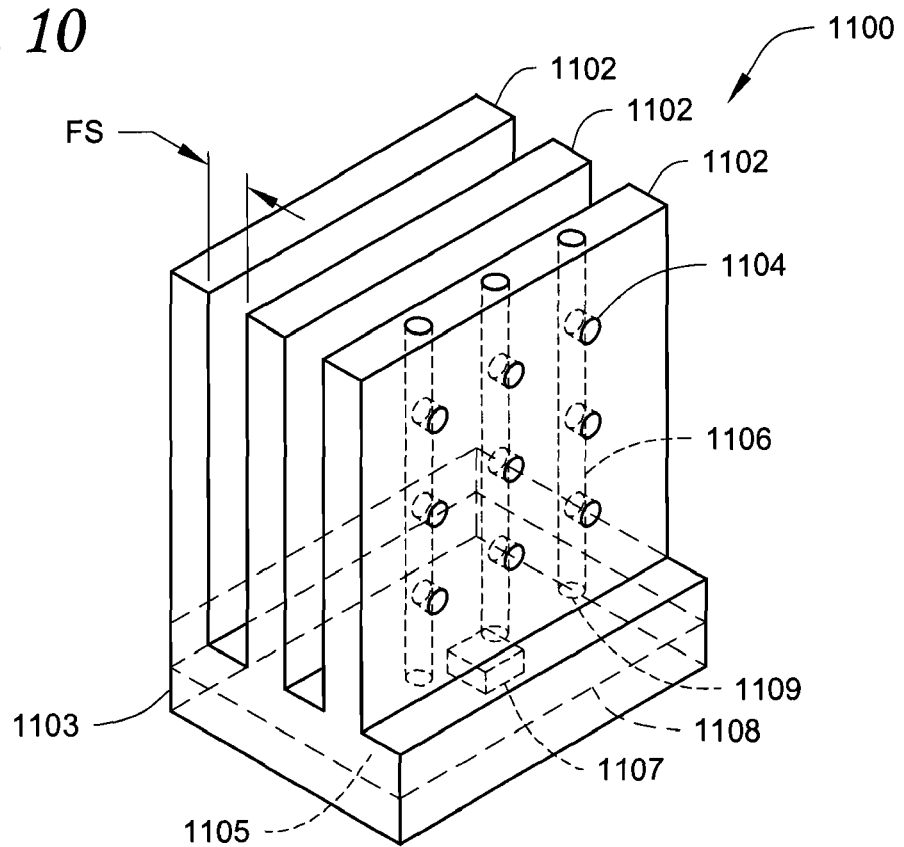
FIG. 10 is a perspective view of one embodiment of a finned heat sink.
Figure 11:
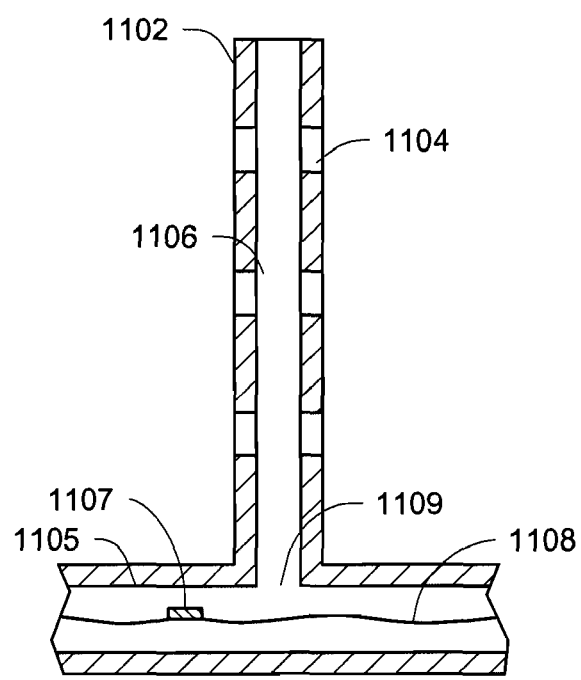
FIG. 11 is a side view one fin and the base of the finned heat sink of FIG. 10.

FIGS. 10 and 11 show an embodiment of a finned heat sink 1100. The finned heat sink 1100 includes a base 1103 and a plurality of fins 1102 connected to at least one side of the base 1103. As one example only, the fins 1102 can be an aluminum material or have aluminum conductive properties, for example 160 W/mK. As shown in FIGS. 10 and 11, a heat exchange device is embedded within the finned heat sink 1100. The heat exchange device includes at least one hole 1104 in each fin 1102, a channel 1106 in each fin in communication with the hole 1104, and a pump 1108 that is embedded in the base 1106. In the example shown, a plurality of holes 1104 are provided in each fin 1102, but it will be appreciated that the number of holes shown is for illustration purposes only. The pump 1108 is disposed within the base creating a chamber 1105. The pump 1108 is operable for increasing and decreasing a volume of air within the channel 1106 of the fins 1102 and the chamber 1105. The chamber 1105 is defined between the pump 1108 and an opening 1109 in communication with the channel 1106 of the fin. The chamber 1105 in some embodiments may be considered to include the volume of the channel 1106 within each fin down to the pump 1108. In other examples, a pump 1108 may be disposed at each opening 1109 so that the chamber is modified to be multiple chambers including only the channel 1106 of each fin 1102 to the outlet of the holes 1104.

A driver 1107 is disposed on the pump 1108 to activate the pump 1108. As one example, the driver 1107 is an actuatable coil that can cause the pump to vibrate, oscillate, or otherwise move so as to increase and decrease the volume and create the jets of air. The pump 1108 may be a diaphragm such as described above or a mesh material that can create the oscillation or vibration when moved. In some examples, the pump 1108 may be operated at an amplitude of about 0.1 inches and at a frequency of about 10 Hz, to create volume changes in the chamber 1105 of about 0.001 in$^3$ to about 0.025 in$^3$. It will be appreciated that other amplitudes and frequencies can be studied to modify the operation of the pump and may include varying the heat loading. Power needed to operate the heat exchange device can be on the order of 0.05

Watts, which would be a negligible amount of heat burden added to the overall system. In other known systems, employing a fan typically would add on the order of 10 Watts to a system, which may not have the space or thermal resources to support such a fan.

As shown in FIGS. 10 and 11, a fin spacing FS is indicated between the fins 1102. The fin spacing FS is less than a fin spacing that would be provided by a criteria defined as the Elenbaas fin spacing criteria. In operation, vortex generation is accomplished by creating jets that provide a flow of air through orifices of the fins, both as intake and exhaust, by activation of a pump or diaphragm that oscillates, vibrates, or otherwise moves. When the pump is activated, the jets or air or vortex bursts are used to break up stagnant boundary layers of heat between the fins and other surfaces of the heat sink. Such a design increases the effective heat transfer of the heat sink.

Figure 12:
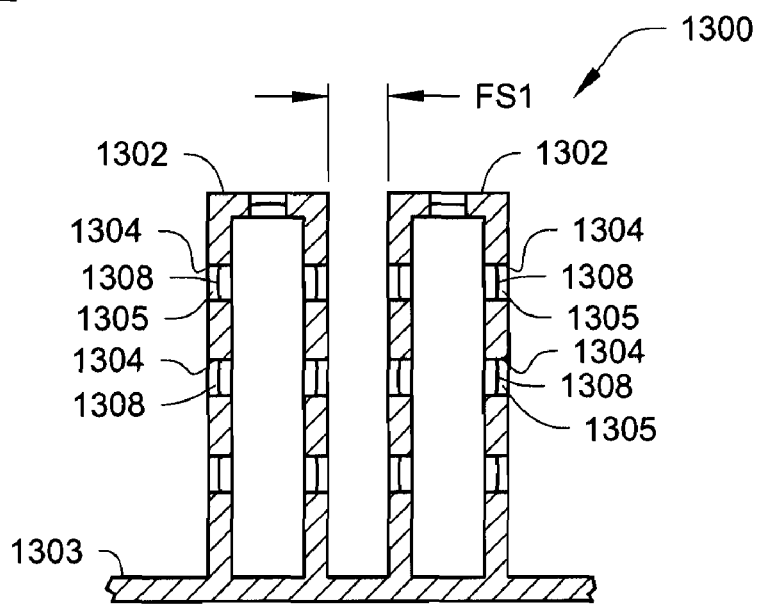
FIG. 12 is a side view of another embodiment of a finned heat sink.

FIG. 12 shows another embodiment of a finned heat sink 1300, where a heat exchange device is embedded within the holes 1304 of each fin 1302. A chamber 1305 is formed within each hole 1304, and between a pump 1308 embedded within the hole 1304 and an outlet of the hole 1304. Different from the finned heat sink 1100, the fins 1302 are connected to a base 1303 that may be of solid construction throughout, since the fins 1302 contain the heat exchange device. The volume in each chamber 1305 can increase and when the pump 1308 is activated to create the jets of air and cause vortex shedding. Similar to the PC circuit boards described above, the pump 1308 may be a piezo activated component that includes a material that can generate an electric potential in response to a sufficient temperature change. When a sufficient temperature change is present, the piezo activated component vibrates, oscillates, or otherwise moves to cause vortex shedding.

Figure 13:
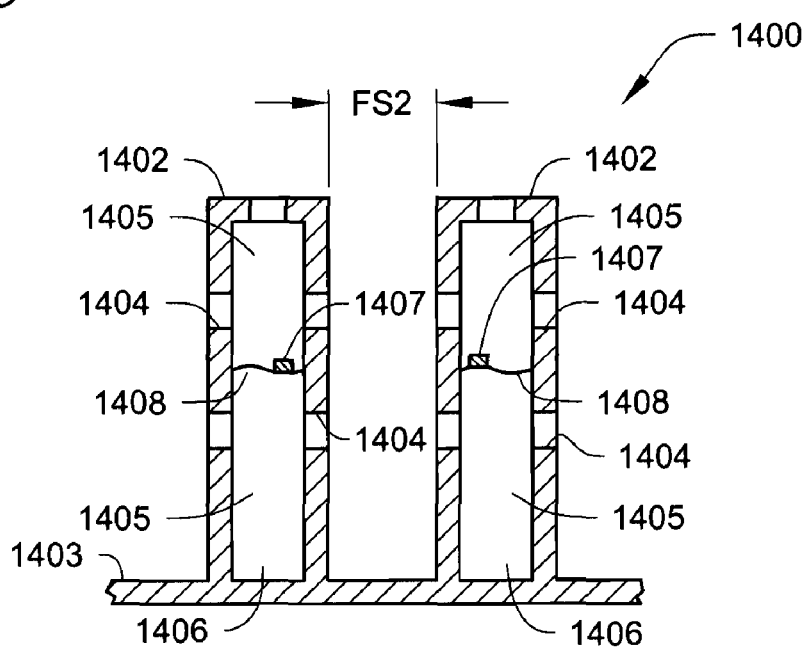
FIG. 13 is a side view of another embodiment of a finned heat sink.

FIG. 13 shows yet another embodiment of a finned heat sink 1400, where a heat exchange device is embedded within the channel 1406 of each fin. A chamber 1405 is formed within the channel of each fin and communicates with each hole 1404. Each chamber 1405 is formed between a pump 1408 and an outlet of a hole 1404. As with the finned heat sink 1300, the fins 1402 are connected to a base 1403 that may be of solid construction throughout, since the fins 1402 contain the heat exchange device. The volume in each chamber 1405 can increase and when the pump 1408 is activated to create the jets of air and cause vortex shedding. The pump 1408 may be a piezo activated component that includes a material that can generate an electric potential in response to a sufficient temperature change. When a sufficient temperature change is present, the piezo activated component vibrates, oscillates, or otherwise moves to cause vortex shedding. In other examples, a driver 1407 may be employed, such as an actuatable coil, which can cause the pump to vibrate, oscillate, or otherwise move, so as to increase and decrease the volume and create the jets of air.

Test Results and Discussion

Inventors' test results have indicated that using a vortex generated flow can significantly improve thermal performance by breaking up stagnant thermal boundary layers. By employing the inventive concepts described herein, thermal performance can be improved by at least about 25% in terms of reducing temperatures than in other conventional natural convection heat sink designs. Smaller fin spacing than the Elenbaas minimum fin spacing criteria can now be achieved by employing vortex generated flow, thereby allowing more fins to be added, and enabling natural convection-cooled heat sinks to utilize more surface area for effective heat transfer.

Inventors have found that when a finned heat sink does not employ the vortex shedding principles described herein, the material of the finned heat sink had significantly higher temperatures than a finned heat sink employing vortex generated flow. Inventors have used two-dimension Computational Fluid Dynamics (CFD) models, which were created using well-known CD programs such as Simulation of Turbulent Flow in Arbitrary Regions (STAR-CD), to compare finned heat sinks with/without employing vortex generated flow and to illustrate some of the advantageous results when vortex generated flow is employed in a finned heat sink. For example, the average heat sink material temperature for a heat sink that did not employ vortex generated flow was about 158.75° C. However, an average heat sink material for a finned heat sink employing vortex generated flow was found to be significantly lower and about at least 31.5° C. lower than a finned heat sink that did not employ vortex generated flow. Further, relative velocity magnitudes have found to be higher in finned heat sinks employing vortex generated flow by about a factor of three or higher, than in finned heat sinks that do not employ vortex generated flow.

As described, the pump may be operated at an amplitude of about 0.1 inches and at a frequency of about 10 Hz, to create volume changes in the chamber of about 0.001 in$^3$ to about 0.025 in$^3$. It will be appreciated that other parameters may be studied to find a more optimal system, where amplitudes and frequencies can be varied to modify the operation of the pump and may include varying the heat loading. For example, the heat loading may be reduced to be more aligned with practical systems, such as under 130° C. Radiation heat transfer can also become an additional factor to further reduce the heat sink material temperature.

As described, a heat sink with vortex generated flow can provide improved thermal performance results by at least about 25%. Equation 4 was used to help illustrate this percentage:

$$1-(T_w-T_{oo})_v/(T_w-T_{oo})_c, \quad \text{Equation 4}$$

where $T_w$ is the average heat sink temperature; $T_{oo}$ is the ambient temperature, for example 36° C.; the subscript v is for a finned heat sink with vortex generated flow; and the subscript c is the control study (or finned heat sink without vortex generated flow).

The temperature differences (the heat sink temperature minus the ambient temperature) are compared to determine the overall thermal performance, which helps determine the convection characteristics of the heat sink and hence the amount of cooling the heat sink is capable of. In other cases studied, a 50 Hz and 100 Hz oscillator were tested. Such other cases showed an increase in cooling efficiency using Equation 4 that respectively were higher than 71% and 84% improvements for thermal performance. See Table 1.

TABLE 1

| Case | $T_w$ [°C.] Heat Sink Average Temp. | dV [in³] ΔVolume ½ stroke | f[Hz] | dT [°C.] compared to Case 1 | $T_w - T_\infty$ [°C.] | Thermal Performance Increase (%) | Comments |
|---|---|---|---|---|---|---|---|
| 1 | 158.75 | 0 | 0 | — | 122.98 | — | control case |
| 2 | 127.26 | 0.025 | 10 | 31.49 | 91.49 | 25.6% | 10 Hz; 0.1" Amplitude |
| 3 | 70.42 | 0.025 | 50 | 88.33 | 34.65 | 71.8% | 50 Hz; 0.1" Amplitude |
| 4 | 54.91 | 0.025 | 100 | 103.84 | 19.14 | 84.4% | 100 Hz; 0.1" Amplitude |

The finned heat sinks described herein operates to draw air into a chamber and expel air out of the chamber through holes of the fins by activation of a pump. Similar to the principles described, the intake and discharge of air through the holes creates jets of air that can disrupt a boundary layer present around the fins. That is, the increasing and decreasing of the volume of a chamber is effective for disrupting a boundary layer of heat. Additionally, the nature of the cooling fin structure allows air to be forced in many directions away from the heat generating component and heat exchange device. Such a configuration can greatly improve the heat transfer characteristics in heat exchange devices employing cooling fins. Thus, adding a heat transfer device with vortex generated flow capability can significantly improve thermal performance. As discussed, this thermal performance increase is accomplished by breaking up stagnant thermal boundary layers between the heat sink fins.

Generally, any of the heat exchange devices described and their inventive concepts provide an improved method of dissipating heat. In operation, heat is conducted to the heat conducting surface of the heat exchange device. The diaphragm is activated, so that air is drawn into a chamber and then forced out through holes fluidly communicating with the chamber. Such an action disrupts a boundary layer of heat present at the heat conducting surface. Heat is dissipated by the intaking of air into the chamber and forcing air out of the chamber through the boundary layer of heat. A pump is employed to draw air into the chamber and expel air out of a chamber. The air expelled from the chamber causes vortex shedding through the boundary layer of heat which dissipates the boundary layer of heat. Air expelled from the chamber as jets of air can further help to disrupt the boundary layer of heat.

It is the intention of the devices and methods described herein to improve upon current forced air and natural convection cooling with the addition of synthetic jets that will greatly improve the heat transfer characteristics of the dissipation system. By employing the inventive concepts described herein, more effective heat transfer can be achieved, which means that less forced air cooling is required. Therefore, due to the low-power input requirements, the improvement in heat transfer can be enjoyed while requiring lower forced air velocity (i.e. smaller fan and less cost and less weight).

It will be appreciated that any of the heat exchange devices can be self-regulating (i.e. through use of a thermocouple) and of low cost. The concepts disclosed herein can also remove requirements for additional power hook-ups that may be required in other assemblies. As described, any of the heat exchange devices and their methods may be employed in various heat producing components, heat sources at a variety of hot spots including, for example, electronics, processors, their assemblies and components, and basically any heat producing component or source having a need to dissipate heat.

The invention may be embodied in other forms without departing from the spirit or novel characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

The invention claimed is:

1. A heat exchange device comprising:
   a heat conducting surface, the heat conducting surface configured to have a boundary layer of heat therearound, the heat conducting surface including at least one hole extending therethrough generally perpendicular to the heat conducting surface;
   a pump connected to the heat conducting surface;
   a chamber between the heat conducting surface and the pump, the chamber having a volume which can increase and decrease to cause a jet of air to be discharged through the hole when the pump is moved; and
   a driver mechanism configured to move the pump to cause increases and decreases in the volume of the chamber as the pump moves;
   the hole, pump, chamber, and driver mechanism are configured to cooperate to draw air into the chamber which disrupts the boundary layer of heat and are configured to cooperate to expel air from the hole to further disrupt the boundary layer and to dissipate heat by vortex shedding through the boundary layer of heat.

2. The heat exchange device according to claim 1, wherein the heat conducting surface including opposing sides, the hole includes an annular surface that is generally perpendicular with respect to the opposing sides.

3. The heat exchange device according to claim 1, wherein the heat conducting surface comprises a plurality of holes.

4. The heat exchange device according to claim 1, wherein the pump is a flexible diaphragm that vibrates when moved by the driver mechanism.

5. The heat exchange device according to claim 1, wherein the pump is connected to a side wall of the heat conducting surface.

6. The heat exchange device according to claim 1, wherein the pump is connected to a bottom side of the heat conducting surface.

7. The heat exchange device according to claim 1, wherein the pump and the chamber span an area occupied by a plurality of the holes.

8. The heat exchange device according to claim 2, comprising a plurality of pumps and a plurality of chambers, each pump and each chamber are associated with a single hole.

9. The heat exchange device according to claim 1, wherein the driver mechanism is a vibration motor.

10. The heat exchange device according to claim 9, wherein the motor is disposed on the pump.

11. The heat exchange device according to claim 1, comprising a thermocouple connected to the driver mechanism.

12. The heat exchange device according to claim 1, wherein the heat conducting surface is part of a PC board.

13. The heat exchange device according to claim 1, wherein the heat conducting surface is part of a finned heat sink.

14. The heat exchange device of claim 1, further comprising a vent configured to facilitate movement of the pump.

15. A circuit board comprising:
   at least one heat conducting surface, the heat conducting surface configured to have a boundary layer of heat therearound, the heat conducting surface including at least one hole extending therethrough generally perpendicular to the heat conducting surface, the hole including an outlet on both sides of the heat conducting surface; and
   a heat exchange device disposed within the hole of the heat conducting surface, the heat exchange device including a pump disposed within the hole and including a chamber formed on both sides of the pump, the pump is movable when a temperature change is present, each chamber is disposed between the pump and one of the outlets and faces toward the sides of the heat conducting surface, each chamber having a volume which can increase and decrease when the pump is moved causing a jet of air to be discharged through the hole;
   the hole, pump, and chamber are configured to cooperate to draw air into the chamber which disrupts the boundary layer of heat and are configured to cooperate to expel air from both outlets of the hole to further disrupt the boundary layer and to dissipate heat by vortex shedding through the boundary layer of heat.

16. The circuit board according to claim 15, comprising a plurality of heat conducting surfaces that are multiple boards disposed adjacent each other and including a space therebetween, each board includes at least one hole extending through major sides of each board and generally perpendicular to the major sides of each board, each hole containing the heat exchange device.

17. The circuit board according to claim 16, wherein the hole of each board configured such that the hole of one board is aligned with the hole of another board, or such that the hole of one board is offset from the hole of another board, or combinations thereof.

18. A finned heat sink comprising:
   a base;
   a plurality of fins connected to at least one side of the base;
   a heat exchange device embedded within one of the plurality of fins and the base or embedded within the plurality of fins, the heat exchange device includes a chamber, at least one hole in each of the fins leading to at least one outlet of each of the fins, the holes are in fluid communication with the chamber, and a pump,
   the plurality of fins having a spacing therebetween that is less than a spacing provided by a criteria defined as the Elenbaas fin spacing criteria.

19. The finned heat sink according to claim 18, wherein the chamber comprises a portion inside of the base and a channel within each fin that is in fluid communication with the portion inside of the base.

20. The finned heat sink according to claim 19, wherein the chamber resides in each fin, the chamber is in fluid communication with the at least one hole of each fin, such that the pump is embedded within one of the chamber or the hole.

* * * * *